United States Patent [19]

Dugan

[11] 4,371,975

[45] Feb. 1, 1983

[54] SAMPLING NRZ DATA PHASE DETECTOR

[75] Inventor: John M. Dugan, Garland, Tex.

[73] Assignee: Rockwell International Corporation, El Segundo, Calif.

[21] Appl. No.: 238,181

[22] Filed: Feb. 25, 1981

[51] Int. Cl.³ .............................................. H03L 7/06
[52] U.S. Cl. .................................. 375/120; 307/516; 328/155; 329/50; 360/51
[58] Field of Search ............... 307/511, 514, 516, 518, 307/520, 521, 526; 328/109, 133, 134, 155; 329/50, 122, 124; 331/1 A, 11, 12; 340/825.7; 360/41, 42, 51; 375/80, 81, 82, 83, 119, 120

[56] References Cited

U.S. PATENT DOCUMENTS

| | | | |
|---|---|---|---|
| 3,968,328 | 7/1976 | Tsuchiya et al. | 360/41 |
| 4,006,423 | 2/1977 | Kuniyoshi et al. | 307/516 |
| 4,020,422 | 4/1977 | Underhill | 307/511 |
| 4,316,150 | 2/1982 | Crosby | 328/133 |

*Primary Examiner*—Benedict V. Safourek

*Attorney, Agent, or Firm*—Terry M. Blackwood; Michael E. Taken; Howard R. Greenberg

[57] ABSTRACT

A digital sampling phase detector is provided for NRZ data phase detection and is particularly suited for applications with long sequences of no data activity. In a phase locked loop application, phase error circuitry detects the phase difference between data transitions and clock transitions of the recovered clock, and outputs phase error signals corresponding to various durations between designated transitions. Sampling switching circuitry responds to a data transition to initiate a measuring interval by forcing the output of the phase error circuitry to a low impedance follower mode to permit sampling, and responds to a designated clock transition to terminate the measuring interval by forcing the output to a high impedance state. The sampling switching circuitry prevents the sampled signal level from drifting during a non-measuring interval, and the reduction of drift significantly reduces jitter in the recovered clock. The sampling function is provided in combination in a high speed ECL phase detector.

17 Claims, 6 Drawing Figures

SAMPLING NRZ DATA PHASE DETECTOR

TECHNICAL FIELD

The invention relates to digital phase detectors for NRZ (non-return-to-zero) data, for example suitable for clock recovery apparatus, such as a phase locked loop, for deriving clock pulses from an NRZ data stream. The invention more particularly relates to a sampling NRZ data phase detector suitable for long sequences of no data activity.

BACKGROUND

In an NRZ data stream, a data pulse stays at one level or another for the entire duration of a bit interval, i.e., for one full clock cycle. For example, a sequence of three consecutive 1's is presented by a constant level signal lasting three bit intervals, or three clock cycles. This is in contrast to an RZ (return-to-zero) data stream wherein a digital 1 is represented by a pulse which does not last the entire bit interval but rather returns to zero. For example, a sequence of three consecutive 1's in an RZ data stream is presented by distinct pulses, each lasting one-half bit interval or clock cycle and returning to zero for the remainder of its clock cycle.

In both NRZ and RZ data streams, it is necessary to have a train of clock pulses providing timing information for demarcation of bit intervals in the identification of 1's and 0's in the data stream. In a communication system, it may be necessary to derive or "recover" clock pulses from the occurrence of the received data pulses.

One kind of circuit used to recover clock pulses from a data stream is a phase locked loop. In this type of circuit, a voltage controlled oscillator (VCO) generates clock pulses which are fed together with received data pulses to a phase detector. The phase detector generates a voltage which is some function of the difference in phase between the data and the clock. The voltage from the phase detector drives the voltage controlled oscillator to produce clock pulses which stay in phase with the data pulses.

My application Ser. No. 06/084,336, "Apparatus for Deriving Clock Pulses from Return-To-Zero Data Pulses," filed Oct. 12, 1979, discloses clock recovery apparatus for RZ data, including a phase detector. In this phase detector, a measuring interval is initiated by a data transition and is terminated by the opposite data transition one-half clock cycle later. The relative time of occurrence of a clock transition within this measuring interval gives an indication of the phase difference between the data and the clock. The duration from a rising data edge to a clock transition is compared against the duration from that clock transition to the falling data edge, and the duration difference corresponds to phase differential. Since each data pulse returns to zero during its bit interval, the falling data edge transition may be used to terminate the measuring interval.

In an NRZ data stream, the falling data edge transition may not be used to terminate the measuring interval because it is not known when such transition will occur. For example, if the next bit is a zero, then the data will transit low at the end of the current bit interval; but if the next data bit is a 1, then the data will stay high and no data edge transition will occur at the end of the current bit interval. In an RZ data stream, a data 1 transits high and then low all within one bit interval (the data pulse has a duration of one-half clock cycle). If the next data bit is also a 1 then the data will again transit high and then low. The falling data edge in an RZ data stream may thus be used to terminate the measuring interval because it is known that such edge transition will occur within the bit interval and one-half clock cycle after the rising data edge. In an NRZ data stream, the time of occurrence of the falling data edge is indeterminate and hence not suitable for providing a known relative timing reference.

Various phase detection schemes have been attempted for NRZ data. An analog approach to NRZ data phase detection involves the use of a differentiator receiving NRZ data and generating positive and negative analog pulses in response to data edges. These analog pulses are typically half or full wave rectified and then fed together with recovered clock pulses to a multiplier mixer whose output is the phase error control to the VCO. This multiplier mixer is typically complex and expensive, particularly at high frequency data rates where transformers may become necessary.

A digital approach to NRZ data phase detection involves the use of a monostable one-shot multivibrator for receiving NRZ data and converting data edges to unidirectional digital pulses. These digital pulses are fed together with recovered clock pulses to a multiplier such as an exclusive OR gate, whose output is the phase error control to the VCO. This multiplier is simpler and less expensive than the above noted analog multiplier. However, a number of problems are presented with the use of the one-shot multivibrator. One-shot multivibrators are prone to variation in output pulse width due to temperature and aging. This affects the clock and data phase relationship and may cause errors in retiming the data with the recovered clock. The pulse width generally becomes a greater problem as the data rate increases, since factors affecting timing become more critical. The phase of the recovered clock in many applications requires correction in order to retime the data correctly. Furthermore, since the one-shot multivibrator produces a pulse of fixed width, the pulse width must be adjusted to the data rate at which the phase detector is to be used.

My application Ser. No. 238,179, entitled "NRZ Data Phase Detector," filed herewith on even date, discloses and claims an improved digital phase detector for NRZ data phase detection. This phase detector overcomes the above noted disadvantages of prior NRZ data phase detectors.

Another problem encountered in NRZ data phase detection is degradation of the phase error control signal over long sequences of no data activity. The phase error control signal from the output of the phase detector represents phase differential as of the most recent data activity. If there is a long interval until the next data transition, then the output signal level is subject to drift, which can cause jitter, or undesired frequency variations, on the recovered clock. If the jitter is severe enough, data errors in retiming, or loss of synchronization may occur.

The present invention provides another improved digital phase detector for NRZ data phase detection, and also addresses the last-noted problem regarding long sequences of no data activity. Other improvements relate to speed and the enablement of a sampling function in an ECL implemented NRZ digital data phase detector.

SUMMARY

The present invention provides a simple and efficient NRZ digital data phase detector and sampling switching means combination for protecting the integrity of the phase error output control signal over long sequences of no data activity.

In one particularly desirable aspect, the invention affords implementation in ECL (emitter coupled logic) to provide extremely high speed operation. The phase error signal is sampled only during active phase measuring intervals initiated by a data transition and terminated by a designated relative clock transition. The phase error circuitry responds and is sampled during the measuring interval. Sampling is prevented outside of the measuring interval.

Phase error circuitry detects the phase difference between data transitions and clock transitions, and outputs phase signals. An energy storage element accumulates and holds the phase signals. Sampling switching circuitry between the phase error circuitry and the energy storage element responds to a data transition to switch to a first state enabling the energy storage element to sample the output of the phase error circuitry, and responds to a designated clock transition following the data transition to switch to a second state isolating the signal level in the energy storage element from erroneous phase information from the phase error circuitry during periods of no data activity.

In the preferred embodiment, the invention enables a sampling function in an ECL implemented NRZ digital data phase detector. The sampling circuitry responds to a designated clock transition terminating the measuring interval and forces the output of the phase error circuitry to a high impedance state. This isolates the phase error signal in the energy storage element from the output of the phase error circuitry. The sampling circuitry responds to the data transition initiating the next measuring interval and returns the output of the phase error circuitry to a low impedance follower mode. This enables the energy storage element to accumulate the phase error signal from the output of the phase error circuitry. The output of the phase error circuitry is thus sampled only during measuring intervals.

The measuring interval is initiated by a data transition which also initiates a variable duration subinterval. This subinterval is terminated by a given clock transition which also initiates a fixed duration subinterval. This fixed duration subinterval and the measuring interval are terminated concurrently by the next clock transition of opposite polarity.

In the preferred embodiment, the phase error circuitry includes output gating circuitry which tracks input logic from first and second gates responding to data and clock transitions. The output gating circuitry provides variable and fixed duration pulses corresponding to the variable and fixed duration subintervals. The fixed duration pulse is initiated by a transition in the input logic. However, the fixed duration pulse is not terminated by a transition in the input logic, but rather by disablement of the tracking. Tracking is disabled by the sampling switching circuitry.

Further in the preferred embodiment, dual switching is provided in the sampling circuitry to cause faster response to the beginning and end of the measuring interval. Switching control gating circuitry is provided in combination with the phase error circuitry.

SUPPLEMENTAL BACKGROUND

The purpose of the sampling performed by the invention will be explained first to facilitate better understanding of the invention, which is described in the next section.

Figure 1:
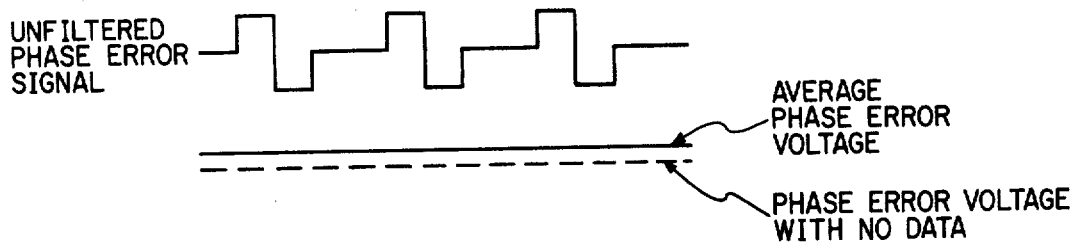
FIGS. 1 and 2 are schematic timing diagrams illustrating phase detector operation as supplemental background to facilitate understanding of the invention.
Figure 2:
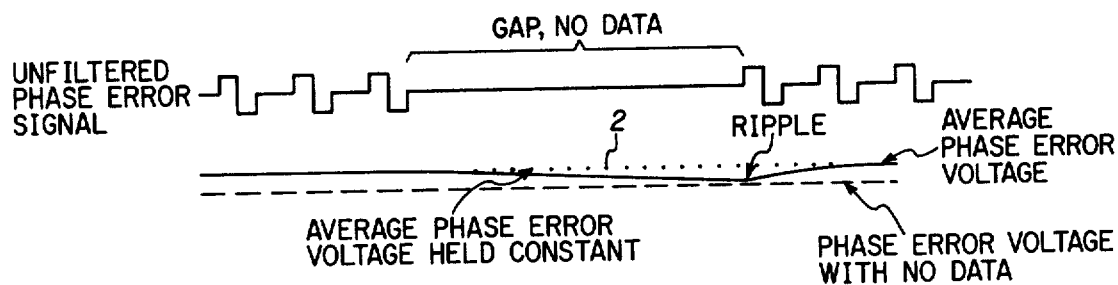

In the non-sampling case, when the phase locked loop is stable and operating properly, there always exists a small difference between the average phase error voltage and the value the phase error voltage would have if there were no data applied, FIG. 1. This small difference is amplified and used to control the VCO frequency. However, if the time between data transitions is highly variable, the average phase error voltage can develop ripples. This occurs due to the fact that the phase detector output is always being averaged, and if no transitions occur for awhile, the average phase error voltage tends to return to the value which indicates no data is being applied, FIG. 2. This ripple in phase error voltage is detrimental, since the frequency of the VCO is changing during gaps in the data. This frequency variation is manifested as jitter, where the clock edge is not stable with respect to the data. This jitter can range from negligible to severe levels, where data errors in retiming occur.

The purpose of sampling the phase error voltage is thus apparent. If the average phase error voltage can be held constant during periods of no data activity, as shown by dotted line 2 in FIG. 2, then the control voltage to the VCO will be constant, and jitter can be reduced.

This is a significant feature of a sampling phase detector and is particularly useful in certain applications. Once a properly-designed phase locked loop with a sampling phase detector is locked-up and stable, it can tolerate much longer sequences of no data transitions over its entire frequency range than an equivalent loop using a non-sampling phase detector.

DETAILED DESCRIPTION

Figure 3:
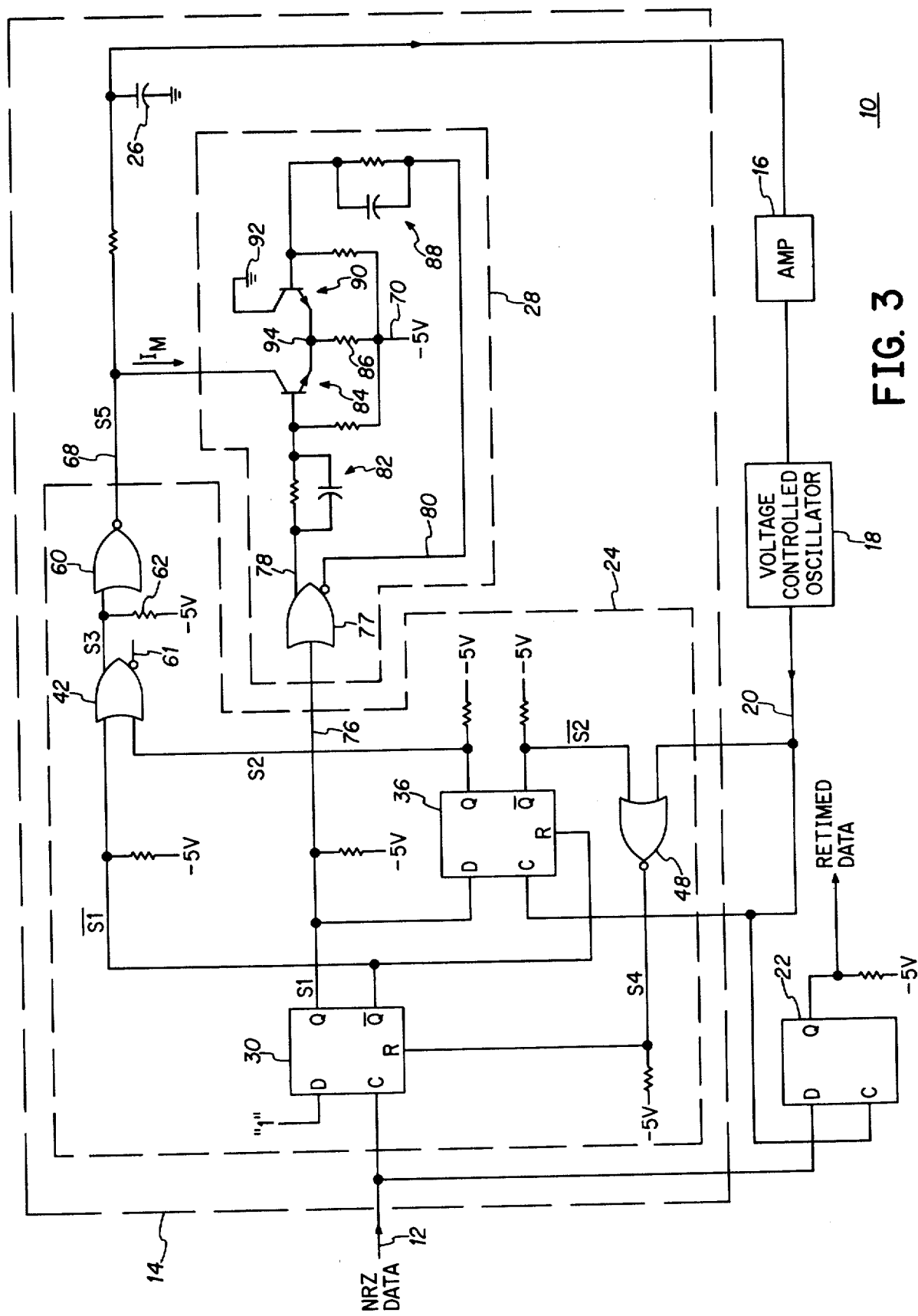
FIG. 3 is a schematic circuit diagram of a phase locked loop for clock recovery from an NRZ data stream for retiming the data, and including a digital sampling phase detector constructed in accordance with the invention.

There is shown in FIG. 3 a phase locked loop 10 for extracting clocking information from an NRZ data stream 12, and including a sampling digital phase detector 14 constructed in accordance with the invention. Sampling phase detector 14 receives the NRZ data and outputs a phase error signal which is amplified by amplifier 16 and fed to a voltage controlled oscillator (VCO) 18 which generates output clock pulses having a frequency dependent upon the input control voltage. The output 20 of VCO 18 is the recovered or extracted clock which is fed back to sampling phase detector 14 for comparison against the NRZ data. Sampling phase detector 14 generates a phase error output signal corresponding to the difference in phase between the NRZ data 12 and the recovered clock 20. This new phase error output signal is amplified by amplifier 16 and fed to VCO 18 which adjusts the output frequency on 20 in response thereto. The recovered clock 20 and the NRZ data 12 may be fed to a retiming flip-flop which outputs retimed data edge-aligned with the recovered clock.

The present invention relates to sampling phase detector 14 shown in dashed line in FIG. 3. The phase error circuitry 24 detects the phase difference between data transitions and clock transitions, and outputs phase signals. An energy storage element 26 accumulates and holds these phase signals. Sampling switching circuitry 28 responds to a data transition to switch to a first state enabling the energy storage element 26 to sample the output of the phase error circuitry 24. The sampling switching circuitry 28 responds to a designated clock transition following the noted data transition to switch to a second state isolating the signal level in the energy storage element 26 from erroneous phase information from the phase error circuitry 24 during periods of no data activity.

Sampling phase detector 14 has a first gate provided by flip-flop 30 responsive to a data transition for initiating a measuring interval. Flip-flop 30 has a D input tied to a high or digital 1 logic state. The C (clock) input receives the NRZ data stream on line 12. The Q output signal, designated S1, FIG. 4, goes high at 32 when the data transitions high at 34.

Figures 4, 5, 6:
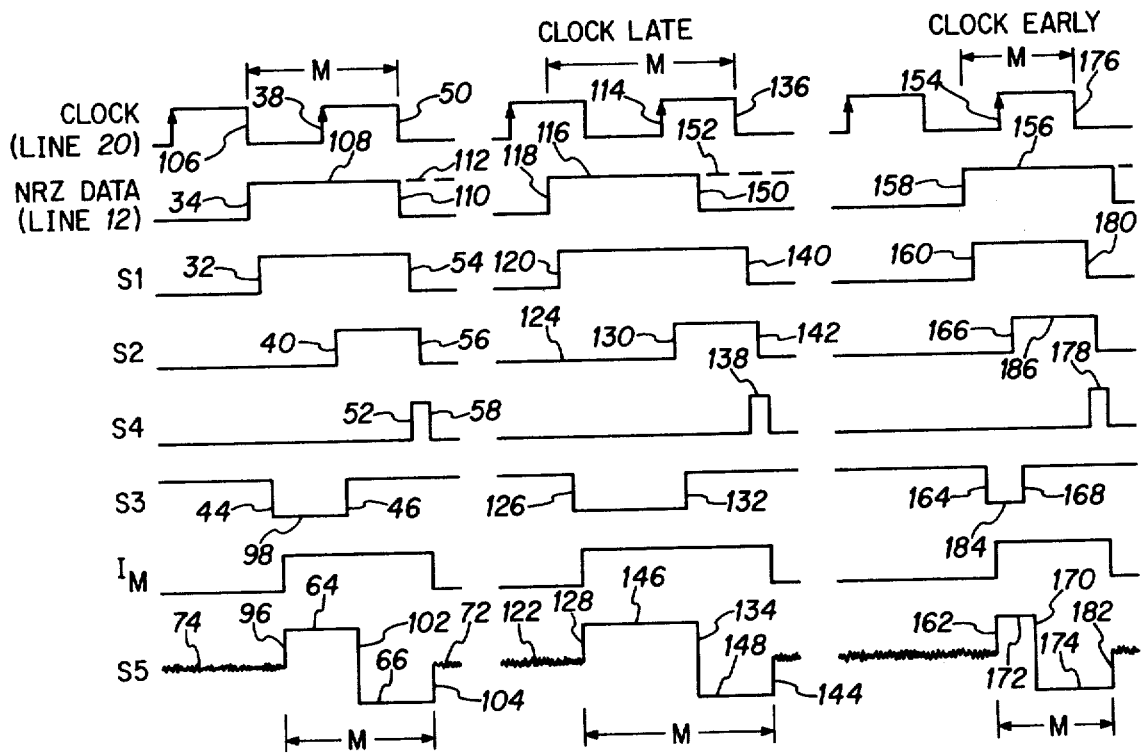
FIGS. 4 through 6 are timing diagrams illustrating operation of the circuit of FIG. 3.

A second gate provided by flip-flop 36 responds to clock pulses and to the output of the first gate 30. Flip-flop 36 has a D input connected to the Q output of flip-flop 30 for receiving the S1 signal. Flip-flop 36 has a C input which receives clock pulses from line 20. Referring to FIG. 4, at the next positive clock transition 38 following data transition 34, the Q output S1 of flip-flop 30 is clocked through flip-flop 36 such that the Q output of flip-flop 36, designated signal S2, goes high at 40.

Output gate means provided by OR gate 42 responds to the outputs of the first and second gates for generating a phase error signal. OR gate 42 has a first input connected to the $\bar{Q}$ output of flip-flop 30 for receiving the inverse of signal S1, and a second input connected to the Q output of flip-flop 36 for receiving signal S2. The output of OR gate 42, designated signal S3, transitions low at 44, FIG. 4, in response to positive going data edge 34. This is because the S2 input to OR gate 42 is low and the other input to OR gate 42 has just transitioned low. At clock transition 38, signal S3 goes high at 46 because its S2 input transitions high at 40.

A reset gate is provided by NOR gate 48 which responds to clock pulses and to the output of the second gate 36 for terminating the measuring interval at a designated clock transition. NOR gate 48 has one input connected to the $\bar{Q}$ output of flip-flop 36, and the other input receiving clock pulses from line 20. After positive clock transition 38, the next successive clock transition, which is negative going edge 50, FIG. 4, causes the output of NOR gate 48, designated signal S4, to go high at 52. This is because the Q output S2 of flip-flop 36 is high and hence the $\bar{Q}$ output of flip-flop 36 is low, and because the clock input from line 20 has just transitioned low, whereby the output of NOR gate 48 goes high.

The output of NOR gate 48 is connected to the reset (R) input of flip-flop 30. Reset pulse 52 causes Q output S1 to transition low at 54. The $\bar{Q}$ output of flip-flop 30 is connected to the R input of flip-flop 36. When S1 transitions low at 54, the $\bar{Q}$ output of flip-flop 30 transitions high which in turn resets flip-flop 36 to cause its Q output S2 to transition low at 56. When S2 transitions low at 56, the $\bar{Q}$ output of flip-flop 36 transitions high, which in turn causes the output S4 of NOR gate 48 to transition back low at 58.

The above described gates are implemented with ECL components. For example, gates 30, 36, and 22 are 1670 components; gate 42 is a 1660 component; and gate 48 is a 1662 component. As seen in FIG. 3, the outputs of these gates are tied to a given reference voltage, such as minus 5 volts, through a pull-down resistor.

The output of OR gate 42 is fed through an inverter 60, such as a NOR gate with a single input. The output of inverter 60 provides the output signal S5 of phase error circuitry 24. Inverter 60 is implemented in ECL, for example a 1662 component. If the output of gate 60 is tied through a pull-down resistor to the minus 5 volt reference source, then S5 will be the inversion of S3. If the output of an ECL gate is not tied to a designated reference voltage in such a way that current can flow from the output, then such output floats at a high impedance state and does not transition in accordance with the dictated logic of its input. Thus, if the output of inverter gate 60 is not tied through a pull-down resistor to the minus 5 volt reference source, then its output S5 assumes a high impedance state, not a low impedance follower mode, and hence S5 does not provide the inverse of S3. Gate 60 is included in the preferred embodiment for delay equalization compensation due to sampling switching circuitry 28. If the data rate is low enough, gate 60 can be omitted, and the output of the phase error circuitry 24 can be taken directly from the NOR output 61 of gate 42, with the resistor connection 62 to minus 5 volts also eliminated.

Referring to FIG. 4, data transition 32 initiates a measuring interval M. Clock transition 50 terminates this measuring interval. Referring to the S5 signal line in FIG. 4, measuring interval M is composed of a variable duration subinterval 64 and a fixed duration subinterval 66. Variable subinterval 64 and measuring interval M are initiated concurrently at data transition 34 and S3 transition 44. Variable subinterval 64 is terminated by the next positive clock transition, which is edge 38, following data transition 34. Clock transition 38 simultaneously initiates fixed duration subinterval 66. Measuring interval M and fixed subinterval 66 are terminated concurrently at the next successive clock transition, which is negative edge 50. Fixed subinterval 66 has a duration of one clock pulse, i.e., one-half clock cycle.

Sampling switching circuitry 28 responds to data transition 34 at the initiation of measuring interval M to switch to a first state allowing current $I_M$ to flow from the output 68 of phase error circuitry 24 to the minus 5 volt reference potential at 70 such that output 68 assumes a low impedance follower mode to inversely track signal S3. Sampling switching circuitry 28 responds to clock transition 50 at the termination of measuring interval M to prevent current flow from output 68 to the minus 5 volt reference at 70 and thus force output 68 back to a high impedance state as shown at 72, FIG. 4. Prior to the measuring interval, output 68 is likewise in a high impedance state, as shown at 74.

Sampling switching circuitry 28 has an input 76 connected to the Q output of flip-flop 30 for receiving signal S1. OR gate 77, such as an ECL 1660, has a single input from 76, and has a true output 78 propagating S1 and an inverted output 80 propagating the inverse of S1. Output 78 is connected through a filter network 82, which contributes to faster turn-on and turn-off, to the base of a transistor 84. When signal S1 goes high at 32, FIG. 2, transistor 84 is base driven into conduction, whereby output 68 of phase error circuitry 24 is tied through resistor 86 to the minus 5 volt reference at 70, i.e., a conductive path is established from output 68 through transistor 84 and resistor 86 to the minus 5 volt reference at 70. Transistor 84 stays conductive during the entire measuring interval M. At reset pulse 52, the Q output S1 of flip-flop 30 transitions low at 54. This removes the base drive from transistor 84 whereby the latter becomes nonconductive and blocks the conduction path from output 68 to point 70.

Referring to FIG. 4, the timing line designated $I_M$ shows the current flow through the collector and emitter of transistor 84. Current $I_M$ flows through transistor 84 only during measuring interval M. During measuring interval M, output 68 is thus in a low impedance follower mode. Outside of measuring interval M, output 68 is in a high impedance state.

Inverted output 80 of gate 77 is connected through a filter 88 to the base of a transistor 90. Since outputs 80 and 78 are inversions of each other, transistor 90 will be on when transistor 84 is off, and vice versa. Transistor 90 is included to provide faster turn-off of transistor 84. When signal S1 transitions low at 54, output 80 transitions high which in turn drives transistor 90 into conduction such that current flows from a given voltage reference 92 through transistor 90 to point 94 and through resistor 86 to point 70. At this same time, base drive to transistor 84 is being diminished due to the negative transition of signal S1 at 54. Due to the conduction of transistor 90, the potential level at point 94 rises, which reverse biases the base-emitter junction of transistor 84, and hence effects faster turn-off of the latter.

In addition to the faster response and the control of $I_M$, the dual transistor circuit allows a response to exist, which is difficult to guarantee when a single transistor is driven by an ECL gate. ECL provides only about 0.9 volts peak to peak of signal swing, which does not leave much signal to use after the 0.7 volt requirement for turn-on of the transistor. Further, the ECL output voltage and the transistor turn-on voltage vary with temperature. The differential transistor pair allows reliable transistor operation with differential drive voltages of less than 0.1 volts peak to peak at the bases.

As seen in FIG. 4, during measuring interval M, output 68 is in a low impedance follower mode and thus signal S5 inversely tracks signal S3. As signal S3 transitions low at 44, signal S5 transitions high at 96. Variable length negative pulse 98 in signal S3 yields variable length positive pulse 64 in signal S5. As signal S3 transitions high at 46 due to positive clock transition 38, signal S5 transitions low at 102 to terminate variable duration pulse 64 and to simultaneously initiate fixed duration pulse 66. The termination of measuring interval M is triggered by falling clock edge 50.

It is important to note that signal S3 does not transition low in response to clock edge 50, and thus positive transition 104 in signal S5 is not due to tracking of signal S3, but rather is due to the turn-off of transistor 84. Turn-off of transistor 84 is caused by negative transition 54 of signal S1, which is in turn caused by the reset pulse started at edge 52 in signal S4, which is in turn caused by clock transition 50. After the termination of the measuring interval M, signal S5 is in a high impedance state 72 and no longer tracks signal S3. At the next positive data transition, such as 34, a new measuring interval is again initiated.

In FIG. 4, the length or duration of positive pulse 64 is equal to the duration of negative pulse 66. The average is thus zero, which indicates an in-phase condition between the clock and data. For the embodiment of FIG. 3, this in-phase condition occurs when a falling clock edge such as 106 aligns with a rising data edge 34. The rising clock edge 38 occurs in the middle of data pulse 108.

As above noted, measuring interval M is initiated by data edge 34 and is terminated by clock edge 50 causing transistor 84 to turn off. NRZ data pulse 108 lasts one full clock cycle and may or may not be terminated at clock edge 50. If the next data bit is a 0, pulse 108 will transition low as shown at 110. If the next data bit is a 1, then the NRZ data signal will remain high as shown at 112. Measuring interval M relies on a data transition 34 for its initiation. Termination of measuring interval M, however, does not rely on a data transition but rather upon a clock transition. With NRZ data, it is not known when falling edge 110 will occur, and hence a clock transition having a known relative time of occurrence is used for termination of measuring interval M.

The averaging of pulses 64 and 66 is effected by an energy storage element, such as capacitor 26 connected to a given potential level. Capacitor 26 is first charged by pulse 64 and then oppositely charged by pulse 66. The resultant net charge is zero and thus the phase error output signal delivered to VCO 18 reflects an in-phase condition, and no compensating adjustment is made to the clock frequency output on line 20.

FIG. 5 illustrates operation of phase detector 14 when the clock pulses on line 20 occur late with respect to the NRZ data on line 12. As seen in FIG. 3, clock transition 114 occurs later than half-way through data pulse 116.

Rising data transition 118 causes the Q output S1 of flip-flop 30 to transition high at 120 which drives transistor 84 into conduction whereby current $I_M$ starts to flow and output 68 returns from high impedance state 122 to a low impedance follower mode. This initiates measuring interval M. When S1 transitions high at 120, the $\overline{Q}$ output of flip-flop 30 transitions low which in combination with the low state of S2 at 124 causes the S3 output of gate 42 to transition low at 126 and the S5 output on line 68 to transition high at 128 since S5 is now allowed to inversely track S3 due to the low impedance follower mode state of output 68. After positive data transition 118, the next positive clock transition, which is edge 114, causes S2 to transition high at 130 which in turn causes S3 to transition high at 132 and S5 to transition low at 134. The next successive clock transition, which is negative edge 136, triggers reset pulse 138 in signal S4 which in turn causes S1 to transition low at 140 and S2 to transition low at 142. The negative transition of S1 at 140 turns off transistor 84 which forces S5 to transition at 144 back to a high impedance state no longer tracking S3.

In FIG. 5, the variable duration subinterval is provided by variable length pulse 146, and the fixed duration subinterval is provided by fixed length pulse 148. Pulse 146 is longer than pulse 148, and this difference in duration provides phase indication. The average of positive pulse 146 and negative pulse 148 is a positive value, and capacitor 26 is left with a net positive charge which is amplified by amplifier 16 and fed to VCO 18 which in turn changes the output clock frequency on line 20 to compensate the lagging clock.

As in FIG. 4, the measuring interval M in FIG. 5 is initiated concurrently with the variable duration subinterval by a positive data transition. Variable duration subinterval 146 is terminated by the next positive going clock transition, which transition simultaneously initiates fixed duration subinterval 148. The next clock transition, which is negative going edge 136, concurrently terminates fixed duration subinterval 148 and measuring interval M. The termination of the fixed duration subinterval 148 at transition 144 is not accomplished by inversely tracking signal S3, but rather by forcing the output 68 of the phase error circuitry 24 back to a high impedance state.

Fixed duration subinterval 148 in FIG. 5 has the same duration as fixed subinterval 66 in FIG. 4, namely one clock pulse, i.e., one-half clock cycle. The variable subinterval 146 in FIG. 5 is longer than variable subinterval 64 in FIG. 4 because the clock in FIG. 5 occurs late with respect to the NRZ data, i.e., positive clock transition 114 occurs later than half-way through NRZ data pulse 116. The measuring interval M in FIG. 5 is thus longer than the measuring interval M in FIG. 2. As in FIG. 2, the measuring interval M in FIG. 5 is initiated by a positive data transition, and the termination of measuring interval M is independent of the falling data edge. As seen in FIG. 5, a falling data edge 150 does not affect or terminate measuring interval M, nor does a continuing high data signal as at 152.

FIG. 6 illustrates operation of phase detector 14 when the clock on line 20 is early with respect to the NRZ data. As shown in FIG. 6, clock transition 154 occurs earlier than half-way through NRZ data pulse 156.

At data transition 158, S1 goes high at 160 which in turn drives transistor 84 into conduction, allowing S5 to transition high at 162 in response to negative transition 164 of S3. At the next positive going clock transition, which is edge 154, S2 transitions high at 166 and S3 transitions high at 168, causing S5 to transition low at 170 to terminate variable duration subinterval 172 and initiate fixed duration subinterval 174. At the next clock transition, which is negative going edge 176, reset pulse 178 is generated in signal S4 which causes S1 to transition low at 180 to turn-off transistor 84 and thus force S5 to transition at 182 back to a high impedance state terminating its tracking of S3. Variable duration subinterval 172 is shorter than fixed duration subinterval 174, which results in an average minus value fed to VCO 18 which in turn reduces the output clock frequency on line 20 to correct the leading clock.

Referring to FIGS. 4 through 6, measuring interval M is initiated by a rising data edge and is unaffected by a falling data edge. Measuring interval M is terminated by a clock edge having a known time of occurrence relative to another clock edge used for terminating the variable duration subinterval. The variable subinterval is initiated by the noted data transition and is terminated by a given polarity clock transition. The fixed subinterval is initiated by this last mentioned clock transition and is terminated by the immediately succeeding clock transition of opposite polarity.

Phase error circuitry 24 includes output gate means provided by components 42 and 60 which tracks input logic $\overline{S1}$ and S2 responding to data and clock transitions. This input logic is from the first and second gate means 30 and 36. The output gate means provides variable and fixed duration pulses in S5 corresponding to the variable and fixed duration subintervals. The fixed duration pulse is initiated by a transition in the input logic $\overline{S1}$ or S2. However, the fixed duration pulse is not terminated by a transition in the input logic, but rather is terminated by disablement of the tracking. As seen in FIG. 6, for example, at the end of the measuring interval M, signal S5 transitions high at 182 because it is disabled from tracking S3, not because of a transition in S3.

Sampling switching cicuitry 28 allows the output 68 of the phase error circuitry 24 to be sampled only during measuring interval M. Outside of measuring interval M, the sampling switching circuitry 28 forces output 68 to a high impedance state to isolate the contents of capacitor 26 from erroneous phase information from phase error circuitry 24. Phase detector 14 is thus particularly well suited to applications involving long sequences of no data activity because the protective isolation of the contents of capacitor 26 afforded by sampling switching circuitry 28 minimizes degradation of the phase error signal level held by capacitor 26. A particularly desirable aspect of the preferred embodiment is the sampling function enablement in a high speed ECL phase detector implementation.

It is recognized that various modifications are possible within the scope of the appended claims.

I claim:

1. A sampling NRZ data phase detector suitable for applications with long sequences of no data activity, comprising:

phase error means for detecting the phase difference between data transitions and clock transitions, and outputting phase signals;

energy storage means for accumulating and holding said phase signals; and sampling switching means between said phase error means and said energy storage means and controlled by said phase error means so as to (i) be responsive to a data transition to switch to a first state enabling said energy storage means to sample the output of said phase error means, and (ii) be responsive to a designated clock transition following said data transition to switch to a second state isolating the signal level in said energy storage means from erroneous phase information from said phase error means.

2. The invention according to claim 1 wherein:

said phase error means comprises:

first gate means responsive to a data transition for activating said sampling switching means to said first state and initiating a measuring interval during which the output of said phase error means may be sampled;

second gate means responsive to clock pulses and to the output of said first gate means;

output gate means responsive to outputs of said first and second gate means for generating a variable duration pulse between said data transition and a given clock transition; and reset gate means responsive to clock pulses and an output of said second gate means for resetting said first gate means in response to a designated clock transition following said given clock transition such that said first gate means activates said sampling switching means to said second state terminating said measuring interval, said output gate means outputting a fixed duration pulse between said last two mentioned clock transitions.

3. The invention according to claim 2 wherein said output gate means provides said variable and fixed duration pulses by tracking input logic from said first and second gate means, said fixed duration pulse being initiated by a transition of said input logic and being terminated by said sampling switching means disabling said tracking.

4. A sampling NRZ data phase detector suitable for applications with long sequences of no data activity, comprising:
   phase error means responsive to a data transition for initiating a measuring interval and responsive to a clock transition for terminating said measuring interval, and including means for generating a variable length subinterval between said data transition and a given polarity clock transition and for generating a fixed length subinterval between designated clock transitions, the duration difference between said variable subinterval and said fixed subinterval providing phase indication; and
   sampling switching means at the output of the said phase error means and switched to a first state at the initiation of said measuring interval to enable sampling of said phase error means, and switched to a second state at the termination of said measuring interval to prevent sampling of said phase error means.

5. The invention according to claim 4 wherein:
   said measuring interval and said variable subinterval are initiated concurrently by said data transition, and said variable subinterval is terminated by said given polarity clock transition; and
   said fixed subinterval is initiated by said last mentioned clock transition, and said measuring interval and said fixed subinterval are terminated concurrently by the immediately succeeding clock transition of opposite polarity.

6. The invention according to claim 4 wherein said phase error means comprises gate means tracking input logic responding to data and clock transitions, said gate means providing variable and fixed duration pulses corresponding to said variable and fixed duration subintervals, said fixed duration pulse being initiated by a transition in said input logic and being terminated by disablement of said tracking.

7. The invention according to claim 6 wherein said disablement is caused by said sampling switching means in response to said clock transition terminating said measuring interval.

8. A sampling NRZ data phase detector implemented in ECL comprising:
   phase error means for detecting the phase difference between data transitions and clock transitions and outputting phase signals, comprising means responsive to a data transition for initiating a measuring interval and responsive to a clock transition for terminating said measuring interval, and including means for generating a variable length subinterval between said data transition and a given polarity clock transition and for generating a fixed length subinterval between designated clock transitions, the duration difference between said variable subinterval and said fixed subinterval providing phase indication;
   energy storage means for accumulating and holding said phase signals; and
   sampling switching means between said phase error means and said energy storage means and responsive to the clock transition at the termination of said measuring interval to force the output of said phase error means to a high impedance state, and returning said output to a low impedance follower mode upon the data transition initiating the next measuring interval, such that said output is sampled only during measuring intervals.

9. The invention according to claim 8 wherein said sampling switching means comprises a transistor switch conductive during said measuring interval to tie said output of said phase error means to a given voltage.

10. A sampling NRZ data phase detector comprising:
    a first flip-flop responsive to a data transition for initiating a measuring interval;
    a second flip-flop responsive to clock pulses and to an output of said first flip-flop;
    output gate means responsive to outputs of said first and second flip-flops for generating a variable duration pulse initated by said data transition and terminated by a given clock transition, and generating a fixed duration pulse initiated by said given clock transition;
    reset gate means responsive to clock pulses and to an output of said second flip-flop for resetting said first flip-flop at a designated clock transition following said given clock transition;
    sampling switching means at the output of said output gate means and responsive to an output of said first flip-flop for forcing the output of said output gate means to a low impedance follower mode at said data transition initiating said measuring interval and said variable duration subinterval, and forcing the output of said output gate means to a high impedance state in response to a designated clock transition following said given clock transition to terminate said fixed duratiion subinterval and said measuring interval, such that said output gate means may be sampled only during said measuring intervals.

11. The invention according to claim 10 wherein said sampling switching means comprises transistor switch means connected to said output of said output gate means and base-driven by an output of said first flip-flop.

12. The invention according to claim 11 wherein said last mentioned output of said first flip-flop is driven to a first state by said data transition at the initiation of said measuring interval and is driven to a second state by said reset gate means at the termination of said measuring interval, said transistor switch means includes a transistor basedriven into conduction during the entire measuring interval by said first flip-flop to tie said output of said output gate means to a give voltage.

13. The invention according to claim 12 wherein said data transition toggles said first flip-flop which drives said output gate means to one state, the next clock transition of one polarity is said given clock transition and clocks an output of said first flip-flop through said second flip-flop to initiate said fixed duration pulse and to drive said output gate means to its opposite state to terminate said variable duration pulse, the next clock transition of opposite polarity drives said reset gate means to its reset state which resets the output of said first flip-flop to terminate said fixed duration pulse and said measuring interval by terminating conduction of said last mentioned transistor switch to drive the output of said output gate means to said high impedance state.

14. The invention according to claim 11 wherein said transistor switch means comprises a pair of transistors alternately driven into conduction by said first flip-flop, one transistor forcing said output of said output gate means between said high and low impedance states, the other transistor providing faster turn-off of said one transistor.

15. The invention according to claim 13 wherein said output gate means comprises an OR gate receiving the Q output of one said flip-flop and the Q output of the other said flip-flop.

16. The invention according to claim 15 wherein:
said first flip-flop has a D input tied to a given logic state, a C input receiving NRZ data, a Q output connected to said transistor switch means, and a $\overline{Q}$ output connected to said OR gate and to a reset input of said second flip-flop;
said second flip-flop has a D input connected to said Q output of said first flip-flop, a C input receiving clock pulses, and a Q output connected to said OR gate; and
said reset gate means comprises a NOR gate connected to a $\overline{Q}$ output of said second flip-flop and receiving clock pulses, and having an output connected to a reset input of said first flip-flop.

17. The invention according to claim 16 wherein said output gate means further comprises a delay equalization gate connected to the output of said OR gate.

* * * * *